United States Patent [19]

Yundt

[11] 4,199,649

[45] Apr. 22, 1980

[54] AMORPHOUS MONOMOLECULAR SURFACE COATINGS

[75] Inventor: Albert P. Yundt, Medfield, Mass.

[73] Assignee: Bard Laboratories, Inc., Amherst, N.H.

[21] Appl. No.: 895,754

[22] Filed: Apr. 12, 1978

[51] Int. Cl.$^2$ .............................................. B32B 9/04
[52] U.S. Cl. ...................................... 428/411; 148/33; 148/33.3; 204/159.13; 260/18 S; 354/354; 357/40; 427/82; 427/96; 427/259; 427/385.5; 427/386; 427/387; 427/407.2; 427/409; 428/426; 428/429; 428/441; 428/449; 428/451; 427/53.1; 427/412.1; 430/5; 430/319; 430/327
[58] Field of Search ...................... 427/54, 82, 96, 259, 427/407 A, 407 C, 409, 385 R, 386, 387; 428/429, 411, 441, 426, 447, 451; 204/159.13, 159.14; 96/35.1, 36.2, 67, 86 R, 86 P; 260/18 S, 46.5 G, 46.5 R; 354/354; 357/40; 148/33, 33.3

[56] References Cited

U.S. PATENT DOCUMENTS

| | | | |
|---|---|---|---|
| 3,115,424 | 12/1963 | Eannarino | 427/82 |
| 3,455,736 | 7/1969 | Davis | 428/901 X |
| 3,628,996 | 12/1971 | Weber | 260/18 S |
| 3,873,499 | 3/1975 | Michael et al. | 260/45.6 E |
| 3,896,254 | 7/1975 | Berkner | 427/54 X |
| 3,916,035 | 10/1975 | Brewer | 204/159.13 X |
| 3,942,982 | 3/1976 | Yanazawa et al. | 96/36.2 X |
| 4,001,870 | 1/1977 | Saiki et al. | 427/82 X |

*Primary Examiner*—John D. Smith
*Assistant Examiner*—Thurman K. Page
*Attorney, Agent, or Firm*—Fitch, Even & Tabin

[57] ABSTRACT

The self-aligning characteristics of surface-active molecules are used to provide a multiply-coupled thin film surface coating on a substrate, comprising an outermost layer of normally fluid, flexible backbone chain polymer units of at least about 30 atoms in length, the ends of which are attached by chemical bonds to a relatively highly polar second layer of atoms serving to anchor the relatively fluid outer surface layer polymer chains to the surface of the substrate.

22 Claims, No Drawings

AMORPHOUS MONOMOLECULAR SURFACE COATINGS

The present invention is directed to thin films and more particularly is directed to the provision of coated substrates having particularly desirable surface properties such as low friction coefficients or low contact hysteresis.

It is known from the classical pioneer work of Langmuir and, later, Adam that soap and related acid and alcohol molecules may be self-aligned in a highly ordered fashion when placed on the surface of water. Extensions of this work by others on the ordered alignment of such molecules in thick films has been carried out [See for example, Glasstone, S.: Textbook of Physical Chemistry, 2nd Ed., pp. 1210–1215, D. Van Nostrand Co., N.Y. (1946) or Adam, N.K.: The Physics and Chemistry of Surfaces, 3rd Ed., Ch. II, but especially pp. 18–55, Oxford University Press, London (1941)]. Such studies primarily concern relatively short molecular chains of uniform length attached to substrates on one end only. The polar groups of the chains may not only be aligned with respect to the substrate but the chains may also be provided in a highly ordered array of a crystalline nature.

It is also known to provide release coatings, thin film or otherwise, of chemical coupling agents for coatings and reinforced plastics for use as chemical adhesion bridges between two surfaces, and of additives to improve the adhesion of lubricating oils to surfaces. In the latter case, the fluid film, the oil itself, is not bonded at all and may readily be removed, whereas the actual bonded material itself, usually a soap, exhibits but little fluid character at its one free end. Surface active agents having polar groups attached at each end of relatively low polarity chain polymers are also known (for example, in respect of detergents, emulsifiers, dispersing and cleaning aids, and the like).

However, there is a need for surface coatings having or providing new or improved properties, such as low friction properties and low hysteresis of wetting properties, despite this known art.

It would be desirable in many circumstances to provide durable, submicrosocopically thin, substantially invisible coatings to particular surfaces to alter the physical and chemical properties of the surfaces. For example, it may be desirable to impart properties such as lubricity (and thus, improved mar resistance), anti-stick (and thus, improved cleanability, a degree of self-cleaning, and resistance to the attachment of organic growths), anti-wetting (and thus, improved electrical surface resistance under conditions of high humidity), or improved resistance to chemical attack by physically warding off contact with corrosive materials which may be present in the environment. For example, the ability to modify or profoundly change one or more surface properties while retaining other desired functional properties of a substrate would be particularly desirable for a wide range of substrates and devices.

It would further be desirable to provide means for forming such coatings in place, either as a distinct operation in itself, or automatically, as a result of adding appropriate precursor materials to paints, lacquers and similar coating materials, should their application be required for other reasons.

Accordingly, it is an object of the present invention to provide methods, coating systems and coated substrates for providing or having improved or desired properties. These and other objects will become more apparent from the following detailed description of the invention.

Generally, in accordance with the present invention, coated substrates are provided which have modified surface properties, comprising the substrate, a substantially monomolecularly thin, randomly oriented (i.e., substantially noncrystalline, amorphous) layer of flexible polymer chains having a plurality of chain ends, and means for bonding the ends of the polymer chains of the layer to the substrate. Relatively long polymer chains are deployed on the surface of a desired substrate so as to be free to fluidly respond to physical deformation forces applied to their exposed outer surface, while being firmly attached to the substrate at the respective ends of the chains. In this connection, the chains may be attached (at their ends by chemical bonds) to a relatively much more polar bonding layer adherent to the substrate. The bonding layer at the time of application may be in the form of attached monomeric or oligomeric polymer chain units, thereby endowing an ease of application, from solution, by a surface-self-attachment process, in the generally-known manner of surface-active agents, but in which the intermediate polymer chain has a substantially noncrystalline, amorphous structure rather than being an ordered, or crystalline array.

The present invention differs from self-aligned, ordered prior art arrays in the same sense that a cut pile carpet differs from loop pile carpet. Acceptable performance of cut pile carpets require that the piling fibers be relatively closely spaced whereas loop pile construction allows a much sparser fill, and the loop itself lends added springiness. Thus, the bonded fluid polymer of the present invention is effective in excluding contact with other solid surfaces at relatively sparse coverages, thereby allowing greater freedom for unrestricted movement, and, in addition, attachment at each end, rather than a single end, greatly reduces the possibility of loss by chain breakage.

The process aspects of the invention involve preparation or application of a surface-active material comprising flexible backbone long chain polymer units chemically attached at each end to groups which must be of a much more highly polar nature, the latter being capable of forming bonds either physically, or most preferably, chemically, to the substrate to which the coating is to be applied, and, preferably, also to each other adjacent the substrate as well. When this material is applied to the chosen substrate, the more highly polar groups will be preferentially attracted to the substrate surface, leaving the less polar portion, the chain polymer groups, outwardly disposed. Various methods of application of a multiple chain end, substrate bondable polymeric material may be utilized. Desirably the material may be diluted with a volatile, substantially inert solvent to permit restricting the application to the extremely small amount of active materials actually required, followed by evaporative removal of the solvent. The substrate to which the coating is to be applied may also be contacted, as by immersing therein, with a similarly diluted solution, made with a solvent of low polarity, so that the active materials will be preferentially attracted onto the surface to be treated. The required minute amount of active material may also be in certain applications, incorporated in a paint, lacquer, or like finishing material, the application of which may have been required for other reasons. In this use, the active materials may be designed to migrate to the surface, self-align in respect of their reactive end groups, and cure in place while the base film itself is drying.

In accordance with the present invention, substrates may be provided with desirable and unusual characteristics such as extremely low static friction coefficients and/or very low hysteresis of wetting and dewetting by liquids. The unusual performance characteristics provided through the use of these films, especially their extremely low static friction constant and very low hysteresis of wetting and dewetting by liquids, almost irrespective of the observed wetting contact angle, are postulated to be explainable as follows, while not intending that the claimed invention be limited or bound by any theory. Thermal energy causes the polymer chains to be in constant motion and, with a relatively sparse "fill" of polymer chains at the surface volume occupied by the chains in view of their random, amorphous, non-crystalline arrangement, the distance away from the substrate surface at which a given chain loops back will be constantly varying. The density of the fluid film may be decreased thereby, but especially so near its outer surface. The usual statistical degree of randomness of chain length characteristic of polymers as normally manufactured is not harmful, but rather would be expected to make this effect even more pronounced, as would a very low characteristic external electrical field for the polymer chosen. Thus, solids may only contact the surface at those points which are highest at a given instant, points which are readily displaced laterally a minute distance by even very small forces, and these points may be replaced by others, similarly displaceable, each successive instant later. Also, air or other fluid molecules in contact with this surface might readily interpenetrate its outermost parts, but might constantly be subject to being "flung out" by the "flailing" thermal motion of the polymer chains.

In this connection, what may be characterized as loop-bonded fluid films may be provided in accordance with the present invention, which may have a characteristic, marked reduction in density at their outermost surface (i.e., away from the substrate surface) where the polymer chains loop back, and any consequent interpenetration of the atmosphere or other surrounding medium may produce markedly modified, useful properties. In this regard, certain aspects of the present invention may be envisioned as an electromechanical development, rather than a purely chemical system, despite the submicroscopic scale of the component parts employed. The broad functional aspects of the chemical means employed as the flexible central chains, and the chemical means for bonding the ends of the chains at the substrate surface, may be selected from a wide variety of chemical means.

In the provision of the substantially monomolecularly thin loop-bonded structures on the selected substrates, it is desirable that the central chain polymer portion should exhibit relatively small unsatisfied electrical fields, that is, though the electrical charge differences between adjacent atoms can be quite high, and thus the bonds quite strong, these should best approximate pure dipoles. There should best be little if any residual unsatisfied charge which depends for its neutralization on an equal and opposite charge located on some more distant atom within the central chain polymer unit. Such polymer units, if prepared separately, may include reactive end groups by which the required more polar end groups may be attached. Suitable reactive end groupings of the polymer chain for attachment to the substrate bonding groups to the ends of the flexible polymer chains include (but are not restricted to) hydroxyl, amine, carbonyl, carboxyl, epoxy, sulfhydryl, carbon-carbon double or triple bonds, etc. Techniques and mechanisms for such attachment, and their permutations and combinations are both numerous and varied. However, they are well known, understood, and widely practiced by those skilled in the appropriate arts. Several are illustrated by the examples herein disclosed and others may be adapted directly from the bonding reactions discussed in the voluminous literature on coupling agents for use in adhesives and filled plastics.

The term "flexible backbone" applied to chain polymers useful in the practice of this invention conveys a specific meaning to polymer chemists. In this connection, all matter is flexible in some degree, and polymer chains especially so, but some more so than others. In chain polymer art, the term is reserved for the latter. In tracing a non-recursive path from one end of such a polymer chain to the other via chemically joined atoms (the polymer backbone), there should best exist few if any segments so traceable via alternative atoms so that resistance to flexure is only that of the individual atomic bonds rather than the rigidity imparted by laterally separated pairs of bonds, one of which must be stretched and the other compressed greatly to produce even small in-plane angular flexures. Such rigidizing is usually caused by ring structures being part of the polymer backbone. This contrasts with the relatively minor steric hinderance effects of such rings when they are attached to a polymer chain as side groups, or sufficiently separated by flexible portions of the chain. In any event, the chain polymer should be sufficiently flexible to form one or more loops at a substrate surface.

It will be evident that in choosing among the various types of polymer chains available for use, those which tend to crystallize in use at the lowest anticipated temperature of use should be rejected because many of the benefits available are believed to depend upon the fluid-like characteristics of the outer surface of the coating. However, the chains are not completely free to assume those exact positions with respect to one another which are mandatory for crystallization to occur. Those atoms near the chain ends are severely constrained, allowable positions being determined by their point of attachment to the substrate; those near the center of the chains are restrained by the necessity for the return loop formation; and the remainder, because of "sparse fill" of the portion of the film they do occupy resulting from their random, substantially non-crystalline, amorphous structure, even under conditions which would cause crystallization of the polymer chains in the absence of the loop-bonding structure, tend to be limited to forming isolated crystal micelles, no larger than about one film thickness, as this is about the maximum distance any chain can "migrate" laterally. Thus, one may expect considerable depression of the temperature of crystallization, a fact which permits full utility for the film at temperatures well below the crystalline melting point temperature for unbonded chains. The magnitude of this depression will depend on many factors, but especially the type and length of the chains, the manner of application (e.g., temperature, solvent conditions, etc.) and the sparseness of fill employed, so it is most simply determined by actual experiment.

For purposes herein, the term "normally fluid" as applied to such chain polymers, including in the appended claims, shall mean that, even at the lowest intended temperature of use for the coating, the material will be capable of a characteristic fluid-like response to deformation forces when tested within the maximum deformation distance limitations which are imposed by attachment of the chain ends to the supporting substrate. Thus, unsubstituted, long linear paraffinic chains form crystals melting generally in the range of 80° to 105° C., though coatings according to the present invention made using them for the central chain polymer component could serve quite well at, for example, elevated temperatures, they should not be expected to be as fully effective at temperatures appreciably lower than that bulk crystallization temperature. However, the same backbone (long chain paraffinic) with low polarity side groupings attached randomly to inhibit crystallization, may remain fully effective at relatively low temperatures. For example, polypropylene chains of suitable length (which are provided with suitable reactive end groupings) make desirable coating materials for use herein, so do random copolymers of propylene and ethylene. Similarly, though chains of poly(ethylene oxide) of normal commercial randomness in length, perform acceptably at 20° C. if their average degree of polymerization is about 15 (i.e., a length of 45 atoms) (bulk freezing point about 30° C.), quite long chains would produce coatings of more restricted utility because the bulk freezing point of such a polymer averaging 65 DP is about 55° C. By contrast poly(propylene oxide), if atactic, would produce coatings which would be satisfactory to quite low temperatures as would random copolymers of the two monomers, as such polymers have quite low bulk freezing temperatures. Siloxane polymers are particularly preferred for use as the backbone polymer component. Further in this connection, hydroxy-terminated poly(dimethyl siloxane) has properties which generally make it the item of choice for this use, however, as few materials are able to adhere to the chain proper.

A wide variety of chain polymers will work in the practice of this invention in its general aspects, but most would do so optimumly only at the elevated temperatures required to permit their fluid flow. For polymer chains averaging at least 30 atoms in length (for many purposes, preferably at least 60 atoms), few remain adequately fluid below 60° C., and fewer yet below 20° C. These facts, and the polymer types to which they apply are well known to those skilled in the related arts and require no further elaboration. Desirably, the chain polymer will have a length of at least about 60 Ångstroms, such that they are capable of forming surface-bound loops of at least 60 Å length between the surface-bonding groups attached to the substrate surface. For many applications, the flexible chain length will preferably be less than about 800 Å and more preferably in the range of from about 100 Å to about 800 Å in length. For polymer chains having more than two ends bound to the substrate surface, the length of each of the resulting loops may be separately determined.

A variety of side groupings may be present on the chains providing that they do not too adversely affect fluidity and chain flexibility. Thus, for example, the methyl groups attached to a polysiloxane backbone may, in certain instances, be advantageously replaced in part or wholly by other groupings, and for example, for some purposes it may be advantageous to replace hydrogen atoms of, say an aliphatic or other hydrocarbon backbone chain polymer with, for example, fluorine atoms, or such like, all without departing from the basic requirements for the chain polymers used in the practice of this invention.

Resistance to chemical chain scission, including simple hydrolysis, is increased by several orders of magnitude if the -silicone-oxygen-silicone- bonding sequence commonly used as the backbone chains in silicone polymers is replaced by a -(carbon)$_x$-silicone-(carbon)$_y$- type of sequence, wherein x and y are low value integers, including one, and are not necessarily identical or even constant along the length of a given chain. For present purposes, including in the appended claims, the term "silicone" should be understood to include products of this nature also.

In the preparation of suitable end-terminated coating materials for providing loop-bonded amorphous surface coatings, relatively highly polar end groups may be provided at the ends of the chain polymer which are of a type coreactive with the chain polymer's end groups to permit the chemical joining of the chain polymer and the end groups, as previously indicated. In another method of preparation, the materials may be so chosen that they serve as initiators and also as terminators of a chain polymerization reaction used in preparing the long chain polymer, becoming attached at each end in the process. In either case, these polar groups should best be such as to be both attracted to and then to bond to the substrate which is to be treated, the latter most preferably, though not necessarily, being by chemical rather than mere physical bonds.

The number of available materials which can serve as the polar groups, or means for chemically bonding the chain ends to the substrate, is quite large, and choice will depend upon the intended conditions of use, including the nature of the substrate to which it is to be attached as well as the nature of the end groupings on the chain polymer, to enable secure attachment by chemical bonding. If the coating material is to be employed as an additive to paints, lacquers and the like, further chemical reactivity can often be dispensed with if the polar group is compatable with and sufficiently bulky to be enveloped by and retained with, but just below, the air interface surface of the cured paint or lacquer film. This is because the main body of the polymer chains may be provided as being less compatable with the other materials present, such as resulting from a polymer's low degree of polarity, tend to exude at the air interface until restrained by resistance of the polar groups to leaving the confines of the base film itself. Under such conditions, the surface film created thereby may be self-limiting in thickness to a monomolecular layer even when the precursor materials are supplied in considerable excess. Epoxy-reactive monomers and oligomers can serve well as the polar groups, as can urethane types. Poly(monomethyl siloxane) polymers of low molecular weight, with or without the addition of small amounts of di- and trimethyl siloxane monomer units, generally work particularly well, especially with silicone-type chain polymers. Though silicone-attached hydroxyl (OH) groups would, in principal, be satisfactory for causing the latter to bond to a wide variety of substrates, considerations of storage stability suggest that they be replaced (temporarily, in effect) by halogen, amine, acetoxy, alkoxy(e.g., methoxy), or similar groups, these being listed in descending order both of deleterious sensitivity to pre-reaction with stray (ambient) moisture before use, as well as the desired reactivity with active sites on the substrate. Upon reaction (e.g., such as with surface silanol groups of a substrate such as a glass substitute), these materials liberate, respectively, in the order listed, halogen, acids, ammonia (or amines), acetic acid, and methanol. Higher organic acids and alcohols can be substituted for the acetoxy and methoxy groups if desirable, but rate of cure will be greatly decreased with increasing molecular size of such alternate. In each case, the silicon-attached radical is replaced by a hydroxyl group. This, in turn, can react with active sites on the substrate surface, thereby firmly attaching the polar end groups to that surface. Typical of the reactive groups found on such surfaces are the hydroxyl groups present on most metal, glass and ceramic surfaces and, to a greater or lesser extent, on various organic polymer surfaces. The latter may be chemically characteristic of the material, as with cellulose and phenolics, or the result of surface degradation reactions (polyesters, alkyds, and surface oxidation products) or surface-seeking defect sites arising from the interior of materials normally not so provided. Similarly, and for the same reasons, organics may possess residual aldehyde or carboxyl groups, or double bonds which are subject to surface oxidation. All may combine with capped, reactive silane groups at the chain polymer ends or silicon-attached hydroxyls to split out water and leave the silicon atom oxygen-bonded to the surface. Double bonds themselves can react also, but do so more readily with properly catalyzed silicon halides, as do free amine groups on protein and nylon surfaces. Epoxies react with these and with carboxyl groups, as do urethanes and urethanes also react well with surface hydroxyl groups. The literature on chemicals, plastics, coatings and tie coats, and especially that on coupling agent additives for use in adhesives or composites, is replete with information concerning securing and facilitating attachment of fluid-applied materials to substrates in general and to specific substrates in particular.

Selection of proper components to be used in the practice of this invention also involves consideration of the solubility characteristics of the separate components, here bearing in mind the general principles of the technology of surface active materials, because the necessity for a self-alignment of the molecules at the surface requires that the combination employed possess strong surface-active characteristics.

Having described the basic considerations in the selections of the ingredients used in the practice of this invention, selected examples will now be described illustrating specific embodiments of the invention. In the specific examples, parts are listed as relative parts by weight unless noted otherwise.

EXAMPLE 1

The following ingredients were mixed together in the order listed, gently heated under reflux for 15 minutes, and then cooled:

| | |
|---|---|
| Poly(dimethyl siloxane), hydroxy terminated at each end, having a degree of polymerization of about 80 (General Electric's SF-69 Silicone Fluid, dehydrated by distillation with toluene) | 20 parts |
| Toluene, containing 0.2 parts stannous octoate | 20 parts |
| Fully methoxy-substituted low molecular weight branched chain oligomer of monomethyl siloxane (Dow Corning's X1-2900 Silicone Resin) | 2 parts |

| -continued | |
|---|---|
| After cooling, the following were added with mixing: | |
| Additional methoxy-substituted methyl siloxane oligomer | 10 parts |
| Toluene | 130 parts |

Additionally, stannaus octoate catalyst, 1 part, may be added to the mix at this time, if desired, to speed rate of film cure after coating.

The diluted mix was shelf-stable, but a solution containing 50% silicone gelled over night. For dip coating use, the formulation would be highly diluted, preferably in the range of from about 400 to about 2000 parts total of diluent per part of contained silicones being suitable for coating smooth surfaces such as glass. The diluent itself should be nonreactive with the silicones. Heptane, toluene, and 1,1,2 trifluoro, 1,2,2, trichloro ethane have proved quite satisfactory. If alcohols other than methanol are present in the catalyzed solution, they will exchange with some of the methoxy groups, and these will be much more difficult to subsequently hydrolize off in order to cure the film. Moisture present in the ambient air or adsorbed on the substrate surface initiates cure. Increasing the temperature greatly accelerates this reaction.

If diluted 400:1 with trichlorotrifluoroethane for dip coating, the active material will "plate out" on many surfaces to produce complete coverage and then the surface will become nonwettable by this solvent or nonreactive with additional loop-bonding coating agent, such that upon removal from the bath, there is no over-treatment by additional solution drying on in place.

Coverage may be provided which is substantially automatically uniformly full and proper without substantial possibility of a thickness greater than a monomolecular thickness of the loop bonding material, thus yielding superior physical properties after a hot cure of 15 minutes in a 250° C. oven (or 2 minutes on a 250° C. hotplate for glass slides). Forming additional layers atop the first monomolecular layer in such dip coating may be accomplished from relatively more concentrated solutions because the polar end groups prefer contact with the solvent to contacting the silicone polymer. Such additional coatout may, consequently, result by means of double-layer type addition wherein the added layer comprises silicone chains on each side of a middle layer containing the polar end groups. Whenever formation of such films is forced by in-place evaporation of a heavy coat of the solvent solution, performance is greatly degraded, but only the usual layer thickness of coating become sufficiently bonded during cure to resist removal by lightly rubbing (such as with the finger) after presoftening with solvent. Good results were obtained also on porcelain tile, chrome and plastic surfaces. Photomasks, of the silver halide in gelatin type, were successfully treated similarly, but required using for cure a 106° C. oven for 4 hours instead to avoid heat damage to the image. Surfaces so treated were highly adhesive, nonwettable except by lower molecular weight non-cyclic aliphatic hydrocarbons, very slick in feel, and have highly desirable wear characteristics. Coefficient of static friction between two smooth glass surfaces so treated was quite low, being difficult to measure using conventional techniques (perhaps less than 0.01), but dynamic friction, though very small, seemed shear rate dependent.

When the combined reaction product used in this example was added to a nitrocellulose-based photosensitive coating lacquer of 10% solids content at 1 part (solvent-free basis) to 20,000 parts of fluid lacquer which was then spincoated to a total dry film thickness of only 800 nanometers, radial wave-rippled lines, caused (in its absence) by air currents, were eliminated and the cured coating showed good abhesive properties and improved resistance to marring because the surface was highly lubricious. Oil-based paints, similarly treated, give similar results after complete cure.

The polar end groups need not be chemically reactive with the substrate to produce good results when the ingredients of this invention are employed as an additive to paint, lacquer and similar finishes, however, as shown by the following:

EXAMPLE 2

The following ingredients were mixed together and boiled 2 hours under high reflux:

| | |
|---|---|
| Hydroxy-terminated poly (dimethyl) siloxane) (sold under the trade designation SF-69 by General Electric) | 90 parts |
| Diethylene glycol monoethyl ether | 10 parts |
| Diisobutyl Ketone (as co-solvent for above) | 200 parts |

At the end of the heating period, loss in weight by evaporation (mostly DIBK, but some glycol ether, moisture, and the water of reaction between terminal silicone hydroxyl groups and those on the glycol) amounted to 180 parts.

When cooled, the mix stayed as a single clear phase, showing that the silicone and glycol hydroxyl groups had coreacted almost completely. A very dilute solution in toluene foamed well when shaken and the quantity and stability of this foam appeared comparable to that obtained using the same concentration of the reaction product of Example 1, thus showing both to be excellently surface active. Nearly identical test results were also obtained at similar dosages in the photosensitive lacquer.

The hydroxyl group terminating each end of the SF-69 silicone oil chains, however, is sufficiently polar to cause some surface activity even before reacting it with other groups of greater total polarity. Foaming when a very dilute solution in toluene is shaken, marked, but much less pronounced than for Example 1 and 2 products treated similarly, confirms this. Activity is sufficient that, taken with the increased mobility permitted by the absence of bulky end groups, when its use is similarly evaluated in the photosensitive lacquers test, prevention of radial ripples is just as effective. However, the chains are not well anchored. They contaminate pressure sensitive adhesives contacting the surface, and most can be removed by repeated wiping. Consequently, mar resistance is much poorer. If methyl-terminated silicone oils are similarly tested, surface activity is negligible. The oil gradually exudes to the lacquer surface in an unorganized unbonded condition, and is readily removed by simple wiping. Even at quite low dosage levels, discrete microdroplets of the oil form in the dried film, making it cloudy in appearance.

EXAMPLE 3

When a methyl-terminated silicone chain polymer of about twice the length of that used in Example 1 was subjected to chain scission with that amount of potassium hydroxide calculated as sufficient to cut each chain in half, followed by aqueous neutralization and drying before use in a mix otherwise similar to Example 1, results were much less satisfactory. Though most of the chains in this case were bonded at only one end, statistically, some of the initial chains must have been cut at more than one site, thus yielding middle fragments which then became doubly bonded. Presumably, the poorer result would have been even worse if no such doubly bonded chains were present.

EXAMPLE 4

The utilization of a heating step to accomplish acceptably rapid cure may be obviated if the methoxyl radicals on the polar end groups, provided to facilitate attachment to the substrate, are replaced by acetoxy groups as these are much more reactive. The following ingredients were refluxed together for an hour and then cooled:

| | |
|---|---|
| Poly(dimethyl siloxane), hydroxy terminated and dehydrated, as in Example 1 | 20 parts |
| Triacetoxy methyl silane (contained a trace of acetic anhydride and triethanol amine used in its preparation from trichloro methyl silane) | 2 parts |

Dilution and use was similar to that of Example 1, but solutions required more rigorous protection from moisture. A day or so exposure of the highly diluted mix to the moisture of the air will degrade it beyond acceptable cure on drying. Even without additional catalyst, films become solvent-resistant after only a few minutes exposure to the air, though complete cure required a day or more unless accelerated by mild heating. Desired properties were not as well met as in the practice of Example 1 unless the substrate was promptly and strongly heated immediately after coating. This perhaps was because rapid reaction with atmospheric moisture causes curing-type reactions, which desirably should occur only at the substrate surface, to also occur at the air interface.

Though this general combination of silicone ingredients has been employed in the past to produce air curing caulking compounds, such products generally include relatively large amounts of finely divided silica. Tests have shown that solvent removal of the silicone components from this silica filler, in order to produce the thin film products of this invention, is not readily possible. Overly thick films made using the ingredients of this invention perform poorly, but those molecules nearest the substrate will be properly aligned and the outer excess may be removed after heat cure by mild mechanical action if presoftened with solvent. A similar action is not possible with cured caulk film. Apparently, bonding between the bottom-most and subsequent layers and interlocking of the polymer chain loops are both minimal. This again confirms the essentially monomolecular nature of the film attained in the practice of this invention, as do experiments in coating glass plates of known area. Weight gain, as measured using a balance sensitive to a few micrograms, when converted to film thickness, was on the order of a quarter of a chain length.

EXAMPLE 5

To a cooled, undiluted (approximately 50% concentration) polymer reaction product according to Example 4, was added, with rapid stirring, 10 parts of fully methoxy substituted low molecular weight branched chain oligomer of monomethyl siloxane (Xl-2900 silicone resin product of Dow Corning). The mixture rapidly becomes very viscous and will quickly gell unless promptly and markedly diluted. A 20% solution in diethyl ketone proved stable, as did a 17% solution in trichlorotrifluoro ethane. Dilution for use and coating was as is in the previous Examples. Speed of cure was intermediate between that of Examples 1 and 4, and addition of stannous octoate catalyst, as in Example 1, proved helpful. Results otherwise were generally comparable to those of Example 1.

Silicone chain polymers used for the practice of this invention will usually be of rather high degree of polymerization. Typically, 10 and 100 centistokes viscosity polymers have weight-averaged degrees of polymerization of about 45 and 230 monomer units per chain, respectively. Thus, the improved degree of before-coating attachment of the silicone polymer chains to the highly cross-linkable silicone resin component attained in Example 4 can, therefore, be accomplished using a much lower proportion of the methyl triacetoxy silane than that employed in Example 4. Additionally, premature gellation during manufacture and use is more readily avoided.

EXAMPLES 6 and 7

The same procedure was followed as in Example 5 except that the amount of metyl triacetoxy silane used was greatly reduced, becoming 0.5 parts for Example 6, and 0.2 parts for Example 7. Rate of viscosity build-up after addition of the Xl-2900 resin was thereby also greatly reduced. It was found that adding the stannous octoate catalyst should be delayed several minutes after the addition of the Xl-2900 resin or gellation of the solution will occur even if the solution is highly diluted immediately after catalyst addition. Also, it is generally preferred to delay a second period after addition of the catalyst, about 15 minutes, before inhibiting the reaction by diluting (to 10% concentration of silicones in toluene).

The degree of stabilization against premature insolubilization attainable simply by dilution is quite remarkable. The diluent may act as a "negative catalyst" by solvating, and thus covering over the reactive sites, thereby inhibiting their getting together in proper orientation to react.

When aluminum is used as the substrate (and presumably other reactive metals also), results from the practice of the above examples is quite poor. All usual silicone curing catalysts, including any acetic acid produced by hydrolysis by moisture of possible acetoxy groups on the polymers corrode such substrates, and possibly catalyze reaction of the substrate metal with atmospheric moisture. An initially smooth polished surface becomes roughened and a few microinches of coating cannot possibly protect it. Aluminum octoate shows catalytic action without this adverse attack on the substrate. In addition to zinc and many other metal salts and acids mentioned in the general literature on silicone resin catalysis, organic amines can also be used as shown in the following example.

EXAMPLE 8

The following ingredients in an Erlenmeyer flask were gently heated at a very slow simmer for 5 minutes to evaporate off traces of moisture:

| | |
|---|---|
| Poly(dimethyl siloxane), hydroxy terminated at each end as in Example 1 (General Electric's SF-69 silicone fluid) | 70 parts |
| Triethylene diamine | 1 part |
| Cool and stir in: | |
| Fully methoxy substituted low molecular weight branched chain oligomer of monomethyl siloxane (DC X1-2900 product of Dow Corning) | 14 parts |

The reactants were capped tightly to protect from atmospheric moisture, heated 4 hours in 95° C. oven to react the ingredients, and recooled. The provision of loop-bonded coatings on photoplates provides masks with particularly desirable wear and performance characteristics in integrated circuit manufacture. Such masks, which may use conventional IC masks (e.g., a glass substrate having a developed photographic or other suitable pattern thereon) as the substrates, on at least the surface of which is adapted to be placed adjacent the semiconductor wafer is provided the loop-bonded film. In the manufacturing procedure, the loop-bonded film coated mask, pressed into intimate contact with the photoresist coated surface of the semiconductor wafer, and exposed to actinic radiation is readily reseparated. The surface properties provided by the loop-bonded coating resulting in substantial improvement in such reseparation. Alternatively, the photoresist layer may be loop-bonded coated.

When diluted 500 to 1 with toluene, dip coated on clean glass, and oven cured 15 minutes at 250° C., this film also is highly abhesive, lubricious, relatively abrasion resistant, and is generally repellant to, and not removable by inert solvents.

Though the usual combination of properties of silicones cause them to be the most frequent item of preference in the practice of this invention, this is not invariably so as areas of application and use requirements cover a very broad range. The following examples demonstrate something of the breadth of applicability of the basic concept.

EXAMPLES 9 through 13

Various chain polymer and polar end group combinations, chosen according to the guidance rules previously described, were tested using catalysts commonly employed with adhesive resins of the same class as the polar group used, and according to the general proportions, and procedures, of Example 8. Table I lists the ingredients used by the code deisgnations listed in Table II.

TABLE I

| Example No. | Chain Polymer Used | End Groups Used | Catalyst Used |
|---|---|---|---|
| 9 | (1) | (7) | (8) |
| 10 | (2) | (5) | (9) |
| 11 | (2) | (7) | (8) |
| 12 | (3) | (6) | (10) |
| 13 | (4) | (5) | (11) |

TABLE II

Descriptions of Ingredients Listed in Table I

A. Chain Polymers (D.P. shown = Approx. Wt. Avg.)
(1) HO—(—CH$_2$—CH$_2$—O—)$_{10}$—H
(2) HO—(—CH$_2$—CH—O—)$_{30}$—H
        |
        CH$_3$ (3) 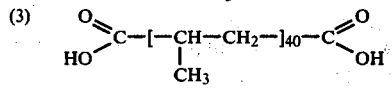

(4) Silicone Fluid SF-69, per Example 1.
B. Polar End Groups
(5) Low Molecular Weight mixed trifunctional aliphatic urethane prepolymer
(6) Low Molecular Weight di-functional Bisphenol A-type epoxy
(7) Silicone Resin X1-2900, per Example 1
C. Catalysts
(8) Stannous Octoate
(9) Triethyl Amine
(10) None
(11) Triethanol Amine Though no effort was made to optimize either proportions, catalysis, or conditions of treatment and cure, when used to treat clean glass surfaces for testing, results were, in each case, generally similar to, though much less strongly advantageous than, the properties noted for surface treatment according to Example 1. Non-wetting was demonstrated even for liquids with which the original chain polymer fluid was miscible in all proportions.

It will also be apparent to those skilled in such matters that the surface treatment of this invention may readily be caused to exist only on selected areas of the surface of a substrate. Intricate detail in the shaping of such areas is possible using techniques well known in the graphic arts and related technologies. For example, the ingredients of the coating might be applied only on the selected areas by ordinary printing methods, or the ability of a uniformly applied overall coating to adhere or remain adhered might be altered for such selected areas by selective area preprinting of the substrate surface with a material for creating, enhancing, or destroying bonding, or simply one that can be readily washed off, and therefore, at those locations only, taking the surface treatment according to this invention with it. Patterning may also be arranged to be accomplished by exposure of selected areas of a uniformly coated surface to light whereupon photochemical reactions occur which selectively either produce bonding sites where previously absent or effectively destroy the attachment of the coating to the substrate. Alternatively, a base coat of conventional photosensitive resist beneath the surface treatment of this invention might be caused to become stabilized or insolubilized locally where so illuminated. In each of these photosensitive examples, the actual patterning of the surface treatment is produced upon using a selective solvent treatment—one standard for the photoresist subcoat employed—after the patterned light exposure.

Such patterned laydown of the surface treatment according to the present invention allows selective area control of surface friction, resistance to fluid wetting, adhesion/abhesion, etc. Examples of the utility of such control would include uses as: pull-string controlled friction devices for speech reproduction in toys and advertising novelties; controlling resistance to wetting for controlled area etching of a substrate; a "dry lithographic" plate wherein ink applied overall would adhere only in selected areas, thus allowing subsequent controlled-area transfer to paper or other printing surface; selective-area determination of points on a package or envelope to which pressure sensitive adhesives can adhere; as an additive in printing inks and photoresists for improved properties in use; etc.

It will be apparent to those skilled in such matters that the doubly-end bonded chain polymer fluid films of this invention may also be produced by alternative methods which, though possibly less convenient or less advantageous in some respect, yield films having properties comparable to those obtained using the preferred methods above described. For example: the two-layers involved might be sequentially applied and then be co-reacted in place; the outer layer only might be applied to an incompletely cured polymer substrate which, during its subsequent cure, will also bond to the end groups of the fluid polymer chains; the polymer chains might be polymerized in place from monomer molecules, the monomer perhaps even being supplied as a vapor rather than as a liquid; and such like.

Various modifications, alterations and adaptations of the teachings of the present disclosure may be made without departing from the spirit and scope of the present invention as defined by the following claims.

What is claimed is:

1. In a method for providing a photoresist pattern on a semiconductor wafer substrate in which a mask surface is passed into intimate contact with the outer surface of a photoresist layer covering a semiconductor wafer substrate, the mask is exposed to actinic radiation for the selective irradiation of the photoresist layer covering the semiconductor substrate and the mask is removed from contact with the photoresist covered semiconductor substrate surface to provide a selectively soluble photoresist pattern on the wafer substrate, the improvement comprising providing for improved separation of the mask surface by coating at least one of said surfaces, with an abhesive, monomolecularly thin, substantially amorphous loop-bonded film, said loop-bonded abhesive film being formed of polymer chains each attached at the same one of said surfaces by bonding groups at the respective ends of said chains to form surface-bound, non-crystalline loops having a length of at least about 60 Ångstroms.

2. A method in accordance with claim 1 wherein said loop-bonded amorphous film is provided on said mask surface and wherein said polymer chains forming said film are loop-bonded siloxane polymer chains having a length of at least about 100 Å.

3. A method for providing a substantially amorphous, non-crystalline, momomolecularly thin film coating on a suitable substrate, comprising the steps of
    providing a solution comprising flexible backbone polymer chain units having a length of at least about 60 Angstroms, said chain units having polar chemical bonding groups chemically bonded to the ends of said chain units said polar bonding groups being adapted for bonding attachment of said polymer chain ends to said substrate, and a solvent for said polymer chain units, and
    contacting said substrate with said solution to orient said polar bonding groups at the ends of said polymer chain units to the surface of said substrate in contact with said solution, and to bond the ends of said chains to said substrate to produce a randomly oriented, substantially momomolecularly thin loop structure of said chains in attachment at said surface.

4. A method in accordance with claim 3 wherein said solution has a weight ratio of said solvent to said end bonding polymer chain units in the range of from about 200 to about 2000.

5. A photomask for use in integrated circuit manufacture comprising a photoplate substrate having a mask pattern thereon, and a substantially amorphous, monomolecularly thin abhesive loop-bonded film on at least the surface of said mask substrate adapted to be placed in contact with a photoresist coated semiconductor wafer during integrated circuit manufacture, said loop-bonded film being formed of normally fluid, flexible polymer chains bonded at their chain ends to said surface to form surface bound noncrystalline loops of said chains projecting from said surface and having a length of at least about 60 Å.

6. A photomask in accordance with claim 5 wherein said polymer chains which form said surface-bound loops of the loop-bonded coating are normally fluid poly siloxane chains having a length in the range of from about 100 to about 800 Å.

7. A coated substrate having modified surface properties comprising a substrate, and an amorphous, substantially monomolecularly thin, non-crystalline loop-bonded layer on said substrate, said amorphous, monomolecularly thin loop-bonded layer being formed of normally fluid flexible polymer chains each having a plurality of chain ends bonded to the substrate surface by means of bonding groups chemically bonded to said chain ends to provide surface-bonded polymer chain loops projecting from said surface and having a length of at least about 60 Å.

8. A coated substrate in accordance with claim 7 wherein said ends of said normally fluid flexible polymer chains are chemically bonded to said substrate by means of siloxane linkages to polar bonding groups chemically bonded to the ends of said chains, and wherein said chain loops have a length in the range of from about 100 to about 800 Å.

9. A coated substrate in accordance with claim 8 wherein said normally fluid flexible polymer chains are selected from the group consisting of polypropylene chains, poly(ethylene oxide) chains, poly(siloxane) chains, and poly(propylene oxide) chains.

10. A coated substrate in accordance with claim 8 wherein said ends of said chains are bonded to said substrate by means of polar bonding groups chemically bonded to said chain ends, said polar bonding groups being selected from the group consisting of epoxy bonding groups, isocyanate bonding groups, polar silanol bonding groups and silanol precursor bonding groups.

11. A coated substrate in accordance with claim 8 wherein said layer is provided in a predetermined pattern on said substrate whereby the surface properties of said substrate are substantially modified at the location of said pattern.

12. A coated substrate in accordance with claim 8 having a low coefficient of static friction.

13. The coated substrate of claim 7 wherein each normally fluid polymer chain is terminated at each end by a relatively highly polar bonding group having five or more atoms, chemically bonded to said polymer chain end, said groups in the aggregate forming an intemediary layer of atoms chemically bonded to said substrate and to said chain ends, and serving to anchor said ends of said looped normally fluid polymer chains to the supporting substrate surface.

14. The coated substrate of claim 13 wherein said relatively highly polar groups are also chemically bonded to one another.

15. The coated substrate of claim 13 wherein said loop-bonded amorphous layer is a film provided by the self-aligning characteristics of said flexible backbone chain polymer units averaging thirty or more atoms in length and bearing said relatively more polar groups of five or more atoms chemically affixed to each end of said normally fluid polymer chains, at the surface of said substrate.

16. The coated substrate of claim 15 wherein said relatively polar end groups are bonded to said substrate surface, leaving said normally fluid chain polymer chains otherwise unbonded to said substrate surface and outwardly disposed in the form of randomly oriented loops having a length in the range of from about 200 to about 800 Å.

17. The coated substrate of claim 13 further including a catalyst for chemically bonding said highly polar end groups to said substrate.

18. The coated substrate of claim 13 wherein said normally fluid polymer chains are silicone polymer chains and said relatively highly polar groups chemically attached to each end of said silicone polymer chain are monomeric to oligomeric derivatives of siloxane reactive at, and chemically bondable to the supporting substrate surface.

19. The layer coated substrate of claim 15 wherein said layer is selectively confined to desired patterned portions of the total surface area of the substrate.

20. A semiconductor substrate for use in integrated circuit manufacture comprising a semiconductor wafer, a photoresist coating on said wafer, and a substantially amorphous, monomolecularly thin film of loop-bonded polymer chains having a length of at least about 60 Angstroms on the surface of said photoresist coating to be placed in contact with a photomask for selective irradiation of said photoresist coating during integrated circuit manufacture said loop bonded chains forming non-crystalline loops projecting from said surface having a length of from about 60 to about 800 Å.

21. A coated substrate having surface properties substantially modified by an amorphous, monomolecularly thin surface coating comprising a supporting substrate and a surface coating on said substrate in the form of a substantially monomolecularly thin amorphous loop-bonded film comprising a first outermost layer of normally fluid flexible backbone chain polymer units averaging at least thirty atoms in length and arranged in the form of loops with their respective ends chemically bonded to relatively polar groupings of five or more atoms at each free end of each of said chain polymer units and forming a second layer of said surface coating immediately adjacent the surface of said supporting substrate and intermediate said substrate and said first outermost layer.

22. The coated substrate of claim 21 wherein said second layer is chemically bonded to the surface of the supporting substrate.

* * * * *

UNITED STATES PATENT AND TRADEMARK OFFICE
CERTIFICATE OF CORRECTION

PATENT NO. : 4,199,649
DATED : April 22, 1980
INVENTOR(S) : Albert P. Yundt

It is certified that error appears in the above—identified patent and that said Letters Patent are hereby corrected as shown below:

Column 6, line 55, "epoxy-reactive monomers" should be --epoxy-reactive resin monomers--.

Column 13, line 54, "stabilized or insolubilized" should be --solubilized or insolubilized--.

Signed and Sealed this

Seventh Day of April 1981

[SEAL]

Attest:

RENE D. TEGTMEYER

Attesting Officer

Acting Commissioner of Patents and Trademarks